US006475694B2

(12) United States Patent
Doi et al.

(10) Patent No.: US 6,475,694 B2
(45) Date of Patent: Nov. 5, 2002

(54) POSITIVE PHOTORESIST COMPOSITION COMPRISING A PHENOLIC COMPOUND HAVING BOTH AN ACID-DECOMPOSABLE GROUP AND A NAPHTHOQUINONEDIAZIDE SULFONYL GROUP

(75) Inventors: Kousuke Doi, Kanagawa (JP); Ken Miyagi, Kanagawa (JP); Atsuko Hirata, Kanagawa (JP); Hidekatsu Kohara, Kanagawa (JP); Toshimasa Nakayama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/863,389

(22) Filed: May 24, 2001

(65) Prior Publication Data

US 2002/0001769 A1 Jan. 3, 2002

(30) Foreign Application Priority Data

May 25, 2000 (JP) ........................................ 2000-154644

(51) Int. Cl.$^7$ ........................... G03F 7/023; G03F 7/039
(52) U.S. Cl. ....................... 430/191; 430/192; 430/193; 430/270.1
(58) Field of Search ................................ 430/191, 192, 430/193, 270.1

(56) References Cited

U.S. PATENT DOCUMENTS 5,580,702 A * 12/1996 Hayase et al. .............. 430/165

FOREIGN PATENT DOCUMENTS

| JP | 5-10775 | 4/1993 |
| JP | 8-262713 | 10/1996 |
| JP | 11-095424 | 4/1999 |

* cited by examiner

Primary Examiner—John S. Chu
(74) Attorney, Agent, or Firm—Sughrue Mion, PLLC

(57) ABSTRACT

A positive photoresist composition includes (A) an alkali-soluble resin, in which part of phenolic hydroxyl groups is protected by an acid-decomposable group; (B) a quinonediazide ester; and (C) a compound which generates an acid upon irradiation of light with a wavelength of 365 nm. This positive photoresist composition can form a fine pattern of about 0.35 $\mu$m in the photolithographic process using i-ray (365 nm), is excellent in focal depth range properties in such an ultrafine region, and has a high sensitivity.

8 Claims, No Drawings

POSITIVE PHOTORESIST COMPOSITION COMPRISING A PHENOLIC COMPOUND HAVING BOTH AN ACID-DECOMPOSABLE GROUP AND A NAPHTHOQUINONEDIAZIDE SULFONYL GROUP

BACKGROUND OF THE INVENTION

1. Field of the Invention

The present invention relates to a positive photoresist composition. Specifically, it relates to a positive photoresist composition that is excellent in focal depth range (depth of focus: DOF) properties and has a high sensitivity in a photolithographic process in which a fine pattern of about 0.35 μm is formed using i-ray (365 nm).

2. Description of the Related Art

Photoresists comprising an alkali-soluble resin and a quinonediazido-group-containing compound are excellent in definition, sensitivity and etch resistance in the photolithographic process using i-ray (365 nm) and have been practically sufficiently used in the manufacture of semiconductor devices and liquid crystal devices.

Conventionally, it has been believed that a fine pattern of a size smaller than the wavelength of light used for exposure cannot be formed, but improvement in materials, process conditions and exposure techniques achieves the formation of a fine pattern of a size of about 0.35 μm which is less than the wavelength of i-ray.

However, both a high definition and a high sensitivity cannot be obtained concurrently, and a high definition resist tends to be low in sensitivity and is not sufficient in DOF properties. Accordingly, such a high definition resist has deteriorated yield or throughput.

Japanese Patent Laid-Open No. 5-107755 (Reference 1) discloses, as a highly sensitive positive photoresist composition, a material composed of an alkali-soluble resin, a naphthoquinonediazide derivative having an acid-decomposable group and a naphthoquinonediazidosulfonyl group, and an acid-generator which generates an acid upon irradiation with active light or radiant ray.

A compound represented by the following Formula (III) is listed as the naphthoquinonediazide derivative, but the resulting composition only achieves a definition of about 0.7 μm.

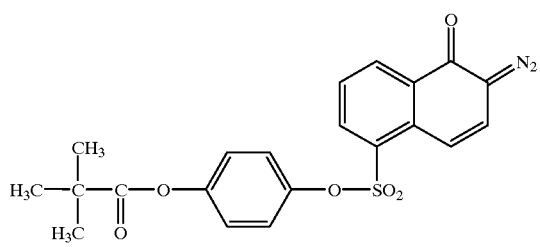

(III)

Japanese Patent Laid-Open No. 8-262713 (Reference 2) discloses, as a positive photoresist composition which is highly sensitive in the deep UV region, a material composed of an alkali-soluble resin, a polyhydroxystyrene-based polymeric substance having an acid-decomposable group and a naphthoquinonediazidosulfonyl group, and an acid-generator which generates an acid upon absorption of light.

Investigations have been made on KrF-, ArF- and other excimer laser light sources as light sources which emit light in the deep UV region, but these light sources require a very expensive aligner (stepper) as compared with that in i-ray light source, inviting higher production costs of semiconductors. Additionally, this material only achieves a definition of about 4 μm.

Japanese Patent Laid-Open No. 11-95424 (Reference 3) discloses a material composed of an alkali-soluble resin, a compound having an acid-decomposable group and a naphthoquinonediazidosulfonyl group, and a compound which generates an acid upon irradiation with light having a wavelength less than 300 nm, as a positive photoresist composition which can form a pattern both upon irradiation with i-ray and upon irradiation with deep UV.

A compound represented by the following Formula (IV) is listed as the compound having an acid-decomposable group and a naphthoquinonediazidosulfonyl group, but the resulting resist composition cannot exhibit a high sensitivity in photolithographic process using i-ray:

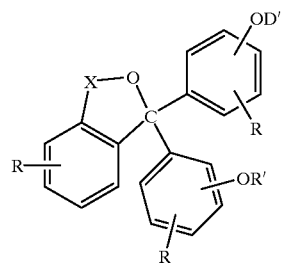

(IV)

wherein D' is a 1,2-naphthoquinonediazidosulfonyl group; R' is an acid-decomposable group; each of R is, for example, independently a hydrogen atom, a halogen atom, an alkyl group, an alkoxy group; and X is CO or $SO_2$.

Japanese Patent Laid-Open No. 6-167805 (Reference 4) discloses a material composed of a quinonediazide ester having a linear tetra- to hepta-nuclear polyphenol skeleton as a photosensitive ingredient, as a high-definition positive photoresist composition.

This material can form a pattern of a size of about 0.35 μm with a good shape, but a higher sensitivity is desired.

Additionally, the DOF properties of this material are only evaluated in 0.45-μm line-and-space (L&S) pattern, and no evaluation is made in the formation of an ultrafine pattern of about 0.35 μm.

SUMMARY OF THE INVENTION

Accordingly, an object of the present invention is to provide a positive photoresist composition that can form a fine pattern of about 0.35 μm in a photolithographic process using i-ray (365 nm), is excellent in DOF properties in such an ultrafine region and has a higher sensitivity.

The present inventors found that the dissolving rates of exposed portions of a photoresist composition in an alkali developer can be markedly improved, while maintaining a high definition, by the use of an acid-generator activated by i-ray (365 nm) and by capping of phenolic hydroxyl groups in an alkali-soluble resin with an acid-decomposable group which is decomposed by action of the generated acid.

They also found that the dissolving rates of exposed portions of a photoresist composition in an alkali developer can be markedly improved, while maintaining a high definition, by the use of an acid-generator activated by i-ray (365 nm) and by capping of phenolic hydroxyl groups in a quinonediazide ester having a specific structure with an acid-decomposable group which is decomposed by action of the generated acid.

Specifically, the present invention provides, in an aspect, a positive photoresist composition including (A) an alkali-soluble resin in which part of phenolic hydroxyl groups is protected by an acid-decomposable group; (B) a quinonediazide ester; and (C) a compound which generates an acid upon irradiation of light with a wavelength of 365 nm.

In another aspect, the present invention provides a positive photoresist composition which includes (A) an alkali-soluble resin; (B) a quinonediazide ester represented by the following Formula (I):

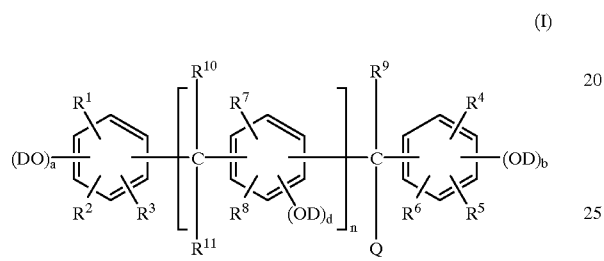

(I)

wherein each of $R^1$ to $R^8$ is independently a hydrogen atom, a halogen atom, an alkyl group having 1 to 6 carbon atoms, an alkoxy group having 1 to 6 carbon atoms, or a cycloalkyl group; each of $R^9$ to $R^{11}$ is independently a hydrogen atom or an alkyl group having 1 to 6 carbon atoms; Q is a hydrogen atom or an alkyl group having 1 to 6 carbon atoms, or Q is combined with $R^9$ to form a cyclic ring having 3 to 6 carbon atom members, or a residue represented by the following Formula (II):

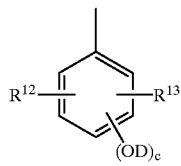

(II)

wherein each of $R^{12}$ and $R^{13}$ is independently a hydrogen atom, a halogen atom, an alkyl group having 1 to 6 carbon atoms, an alkoxy group having 1 to 6 carbon atoms, or a cycloalkyl group; and c denotes an integer of 1 to 3; each of D is independently a hydrogen atom, a 1,2-naphthoquinonediazidosulfonyl group or an acid-decomposable group, where at least one of D is a 1,2-naphthoquinonediazidosulfonyl group and at least one of D is an acid-decomposable group; each of a and b denotes an integer of 1 to 3; d denotes an integer of 0 to 3; and n denotes an integer of 0 to 3; and (C) a compound which generates an acid upon irradiation of light with a wavelength of 365 nm.

Preferably, part of phenolic hydroxyl groups in Ingredient (A) in the aforementioned positive photoresist composition is protected by an acid-decomposable group.

In the positive photoresist composition, a quinonediazide ester represented by the following Formula (I-a) may be contained as Ingredient (B):

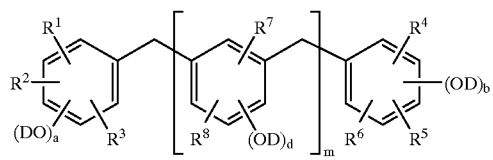

(I-a)

wherein $R^1$ to $R^8$, D, a, b and d have the same meanings as defined above; and m denotes an integer of 1 to 3.

Alternatively, a quinonediazide ester represented by the following Formula (I-b) may be contained as Ingredient (B):

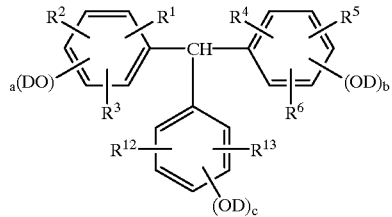

(I-b)

wherein $R^1$ to $R^6$, $R^{12}$, $R^{13}$, D, a, b and c have the same meanings as defined above.

In the invented positive photoresist composition, the acid-decomposable group may be a group represented by the following Structural Formula (a-1):

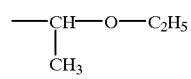

(a-1)

Alternatively, the acid-decomposable group may be a group represented by the following Structural Formula (a-2):

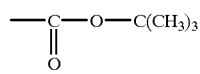

(a-2)

From 5% to 50% of the total phenolic hydroxyl groups of Ingredient (A) in the positive photoresist composition may be protected by an acid-decomposable group.

Alternatively, from 10% to 50% of the total phenolic hydroxyl groups of Ingredient (B) in the positive photoresist composition may be protected by an acid-decomposable group.

DESCRIPTION OF THE PREFERRED EMBODIMENTS

Alkali-soluble Resin (A)

Alkali-soluble resins for use as Ingredient (A) are not specifically limited and can be optionally chosen from those generally used as film-forming substances in positive photoresist compositions. Of these resins, condensates of aromatic hydroxy compounds and aldehydes or ketones, polyhydroxystyrenes and derivatives thereof are preferable.

Such aromatic hydroxy compounds include, but are not limited to, phenol, m-cresol, p-cresol, o-cresol, and other cresols; 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these compounds can be used alone or in combination.

The aldehydes include, but are not limited to, formaldehyde, paraformaldehyde, trioxane, acetaldehyde, propionaldehyde, butylaldehyde, trimethylacetaldehyde, acrolein (acrylaldehyde), crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Of these aldehydes, formaldehyde is desirable for its availability. Particularly, the combination use of a hydroxybenzaldehyde and formaldehyde is preferred in order to improve heat resistance.

The ketones include, for example, acetone, methyl ethyl ketone, diethyl ketone, and diphenyl ketone. Each of these ketones may be used alone or in combination. Further, an appropriate combination of an aldehyde and a ketone can be employed.

The condensate of an aromatic hydroxy compound and an aldehyde or a ketone can be prepared in the presence of an acidic catalyst according to a known technique. Such acidic catalysts include, but are not limited to, hydrochloric acid, sulfuric acid, formic acid, oxalic acid, and p-toluenesulfonic acid.

The polyhydroxystyrenes and derivatives thereof include, but are not limited to, vinylphenol homopolymers, and copolymers of vinylphenol and a copolymerizable comonomer. Such comonomers include, for example, acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene, and other styrene derivatives.

Of these alkali-soluble resins for use in the present invention as Ingredient (A), preferred resins are novolak resins, hydroxystyrene-based resins and derivatives thereof each having a weight average molecular weight (Mw) in terms of polystyrene of from 2000 to 25000, and typically from 2500 to 20000 as determined by gel permeation chromatography (GPC). If the weight average molecular weight is less than 2000, and particularly 1000 or less, the resulting photoresist composition may have a markedly deteriorated definition. If the weight average molecular weight is excessively high, the resulting photoresist composition may be deteriorated in coating performance, and the weight average molecular weight is therefore preferably selected within a range not exceeding 25000.

Incidentally, low molecular weight fractions of Ingredient (A) should be preferably removed. Such low molecular weight fractions can be removed by any process, and preferably in the following manner. Initially, a novolak resin solution, for example, is dissolved in methyl amyl ketone (MAK), and the resulting mixture is washed with water to remove a catalyst and unreacted materials. To the resulting mixture, a poor solvent such as hexane or heptane, or a mixture hexane and MAK, or a mixture heptane and MAK is added, and the mixture is then stirred and is allowed to stand to separate a poor solvent layer as an upper layer, and an MAX layer as a lower layer. The upper layer contains low molecular weight fractions, and the lower layer contains high molecular weight fractions. By extracting the lower layer, a high molecular weight novolak resin can be obtained.

According to the present invention, at least part of phenolic hydroxyl groups in alkali-soluble resin (A) is protected by a group which is decomposed by action of an acid catalytic reaction to become soluble in alkali, i.e., an acid-decomposable group, or at least part of phenolic hydroxyl groups in quinonediazide ester (B) is protected by such an acid-decomposable group. Additionally, both part of the phenolic hydroxyl groups of Ingredient (A) and part of the phenolic hydroxyl groups of Ingredient (B) may be protected by an acid-decomposable group. This configuration can enhances development contrast between unexposed portions and exposed portions and can improve DOF properties without deterioration of definition.

When quinonediazide ester (B) has no acid-decomposable group, part of phenolic hydroxyl groups in alkali-soluble resin (A) must be protected by an acid-decomposable group. In this case, a resin for use as Ingredient (A) should preferably have a high dissolving rate to achieve a higher photosensitivity.

Such resins having a high dissolving rate for use as Ingredient (A) include, for example, resins having a low weight average molecular weight, novolak resins containing large proportions of phenol, m-cresol, o-cresol, hydroquinone, catechol, resorcinol, pyrogallol, and other units, and hydroxystyrene-based resins containing a large proportion of a hydroxystyrene unit.

Among them, preferable novolak resins are novolak resins having a weight average molecular weight of from 2500 to 5000 obtained by a condensation reaction of at least one phenol selected from phenol, m-cresol and o-cresol with formaldehyde.

Preferable hydroxystyrene-based resins are polyhydroxystyrenes having a weight average molecular weight of from 5000 to 10000.

Acid-decomposable groups for protecting part of phenolic hydroxyl groups in Ingredient (A) or Ingredient (B) may be any groups that are decomposed or dissociated by action of an acid generated from Ingredient (C) mentioned below. Such acid-decomposable groups include, but are not limited to, 1-ethoxymethyl group, 1-ethoxyethyl group, 1-propoxymethyl group, 1-propoxyethyl group, 1-n-butoxymethyl group, 1-iso-butoxymethyl group, 1-tert-butoxymethyl group, and other alkoxyalkyl groups; t-butoxycarbonyl group, t-butoxycarbonylmethyl group, t-butoxycarbonylethyl group, and other alkoxycarbonylalkyl group; tetrahydrofuranyl group; tetrahydropyranyl group; straight- or branched-chain acetal groups; cyclic acetal groups; trimethylsilyl group, triethylsilyl group, triphenylsilyl group, and other trialkylsilyl or triarylsilyl groups. Among them, ethylvinyl group (ethoxyethyl group) represented by Formula (a-1) and t-butoxycarbonyl group represented by Formula (a-2) are preferable to yield a positive photoresist composition having a high definition, of which ethylvinyl group is typically preferred. An ethylvinyl group protects a phenolic hydroxyl group in Ingredient (A) or Ingredient (B) to form a structure represented by the following Structural Formula (A-1):

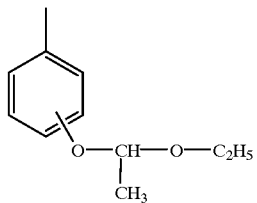

(A-1)

and a t-butoxycarbonyl group protects the phenolic hydroxyl group to form a structure represented by the following Structural Formula (A-2):

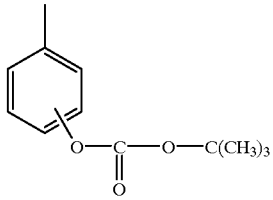

(A-2)

In Ingredient (A), preferably 3% or more, and more preferably from about 5% to about 50% of the total phenolic hydroxyl groups in the resin may be protected, depending on the type of the protective group. If the ratio of protected phenolic hydroxyl groups is excessively low, the resulting photoresist composition may have insufficient development contrast, and may fail to exhibit satisfactory definition and DOF properties. If the ratio is excessively high, sensitivity may be deteriorated.

In the present invention, Ingredient (A), in which part of phenolic hydroxyl groups is protected by an acid-decomposable group, can be prepared by any conventional process which is not specifically limited, and, for example, can be prepared by the following process. Initially, Ingredient (A) is dissolved in an organic solvent, and to the resulting solution, a basic catalyst and a compound corresponding to the acid-decomposable group are added; the mixture is allowed to react at a temperature from about 20° C. to about 70° C. for about 1 hour to about 10 hours; the reaction mixture is put into a large amount of an aqueous acid solution or water; is allowed to stand; the organic solvent layer (upper layer) is separated and is washed several times with an aqueous acid solution or water to thereby remove the basic catalyst and salts from the reaction mixture; and the organic solvent is distilled off from the mixture under reduced pressure to thereby yield Ingredient (A) for use in the invention, in which part of phenolic hydroxyl groups is protected by an acid-decomposable group.

Such organic solvents include any solvents in which Ingredient (A) is dissolved, such as methanol, ethanol, propanol, butanol, ethylene glycol, propylene glycol, and other alcohols; diethylene glycol dimethyl ether, propylene glycol monopropyl ether, 1,2-dimethoxyethane, 1,2-diethoxyethane, and other ethers; tetrahydrofuran, dioxane, and other cyclic ethers; acetone, methyl ethyl ketone, methyl isobutyl ketone, methyl amyl ketone, and other ketones; and γ-butyrolactone and other cyclic esters. The organic solvents for use in the above process are preferably solvents that are not mixed with the aqueous acid solution or water used in the washing step after reaction, and such solvents include methyl amyl ketone and γ-butyrolactone.

The basic catalyst includes, but is not limited to, ethylamine, ethanolamine, diethylamine, diisopropylamine, diethanolamine, dicyclohexylamine, and other primary or secondary amines; trimethylamine, triethylamine, tripropylamine, and other tertiary amines containing lower alkyl groups, of which triethylamine is typically preferred.

The compound corresponding to the acid-decomposable group includes, for example, 1-chloro-1-ethoxyethane and 1-ethoxyethene when the acid-decomposable group is ethylvinyl group, and includes di-tert-butyl dicarbonate when the acid-decomposable group is t-butoxycarbonyl group.

To avoid the decomposition of the acid-decomposable group by the acid, the aqueous acid solution for use in the process is preferably a solution of a weak acid, such as an aqueous acetic acid solution.

Quinonediazide Ester (B)

Quinonediazide esters for use as Ingredient (B) are not specifically limited and can be optionally chosen from those generally used as sensitizer in positive photoresist compositions. Such Ingredient (B) includes the conventional esters of a 1,2-naphthoquinonediazidosulfonyl compound and a polyphenol compound. Preferred examples of the polyphenol compounds include linear polyphenol compounds such as 2,4-bis (3,5-dimethyl-4-hydroxybenzyl)-5-hydroxyphenol, 2,6-bis (3,5-dimethyl-4-hydroxybenzyl)-4-methylphenol, and other linear trinuclear compounds; bis [2,5-dimethyl-3-(4-hydroxy-5-methylbenzyl)-4-hydroxyphenyl]methane, bis [2,5-dimethyl-3-(2-hydroxy-5-methylbenzyl)-4-hydroxyphenyl]methane, bis [2,5-dimethyl-3-(4-hydroxybenzyl)-4-hydroxyphenyl]methane, bis [2,5-dimethyl-3-(2,4-dihydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and other linear pentanuclear compounds.

In the above embodiment, the ester can be prepared by subjecting, for example, the 1,2-naphthoquinonediazidesulfonyl halide and the polyphenol compound to a condensation reaction to completely or partially esterify these compounds. The condensation reaction is advantageously performed in an organic solvent in the presence of a basic condensing agent. Such organic solvents include, for example, dioxane, N-methylpyrrolidone, and dimethylacetamide; and such basic condensing agents include, for example, triethylamine, an alkali carbonate, and an alkali hydrogencarbonate. The resulting ester should be preferably obtained by condensing 50% by mole or more, preferably 60% by mole or more of, for example, a 1,2-naphthoquinonediazide-4(or -5)-sulfonyl halide relative to the total mole of hydroxyl groups in the polyphenol compound (i.e., the rate of esterification is 50% or more, and preferably 60% or more). The positive photoresist composition using such esters can yield higher definition.

When Ingredient (A) has no acid-decomposable group, the use of a quinonediazide ester represented by Formula (I) as Ingredient (B) can yield a high-definition positive photoresist composition that is excellent in sensitivity and definition in the photolithographic process using i-ray and is specifically suitable for the photolithographic process to form a fine pattern of not more than 0.35 µm.

Acid-decomposable groups to protect part of phenolic hydroxyl groups in Ingredient (B) include those mentioned in the explanation of Ingredient (A).

For higher definition of the resulting resist composition, preferred quinonediazide esters among the quinonediazide esters represented by Formula (I) are a quinonediazide ester represented by the following Formula (I-a) which is an ester of a linear polyphenolic compound:

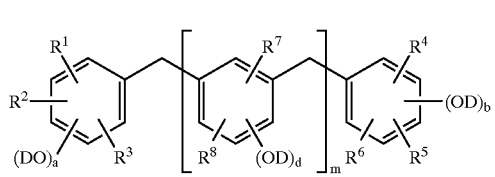

(I-a)

wherein $R^1$ to $R^8$, D, a, b and d have the same meanings as defined above; and m denotes an integer of 1 to 3, and a quinonediazide ester represented by the following Formula (I-b) which is an ester of a trisphenol-type polyphenolic compound:

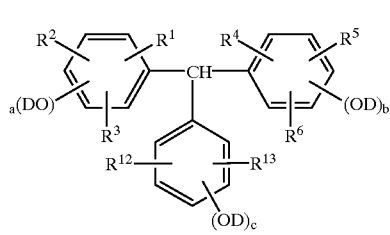

(I-b)

wherein $R^1$ to $R^6$, $R^{12}$, $R^{13}$, D, a, b and c have the same meanings as defined above.

Preferably 10% or more, and more preferably from 20% to 70% of the total phenolic hydroxyl groups of the quinonediazide ester of Formula (I) should be esterified. Preferably 5% or more, and more preferably from about 10% to about 50% of the total phenolic hydroxyl groups of Ingredient (B) should be protected by the acid-decomposable group. If the esterification rate or protection rate is lower than the above range, development contrast may be insufficient, and satisfactory definition and DOF properties may not be obtained. If it is excessively high, sensitivity may be deteriorated.

Processes for the preparation of Ingredient (B), in which part of phenolic hydroxyl groups is protected by the acid-decomposable group, include the following three processes: (1) a process in which the acid-decomposable group is introduced into a phenolic compound and the resulting phenolic compound is esterified with quinonediazide; (2) a process in which a phenolic compound is esterified with quinonediazide, and the acid-decomposable group is introduced into the resulting ester; and (3) a process in which a phenolic compound is subjected to the introduction of the acid-decomposable group and the esterification with quinonediazide, concurrently.

The acid-decomposable group can be introduced in a similar manner as in the esterification reaction with quinonediazide. Specifically, in process (1), the quinonediazide ester for use in the present invention, in which part of phenolic hydroxyl groups is protected by the acid-decomposable group, can be obtained in the following manner. Initially, a phenolic compound is dissolved in an organic solvent, and to the resulting solution, a basic catalyst and a compound corresponding to the acid-decomposable group are added; the mixture is allowed to react at a temperature from about 20° C. to about 70° C. for about 1 hour to about 10 hours; the reaction mixture is put into a large amount of an aqueous acid solution or water and is allowed to stand; the organic solvent layer (upper layer) is separated and is washed several times with an aqueous acid solution or water to thereby remove the basic catalyst and salts from the reaction mixture; and the organic solvent is distilled off from the mixture under reduced pressure to thereby yield a phenolic compound in which part of phenolic hydroxyl groups is protected by the acid-decomposable group. This phenolic compound is then dissolved in an organic solvent, and to the resulting solution, a basic catalyst and a 1,2-naphthoquinonediazidosulfonyl halide are added, and the mixture is allowed to react at a temperature from about 20° C. to about 70° C. for about 1 hour to about 10 hours; the reaction mixture is put into a large amount of an aqueous acid solution or water and is allowed to stand; the organic solvent layer (upper layer) is separated and is washed several times with an aqueous acid solution or water to thereby remove the basic catalyst and salts from the reaction mixture; and the organic solvent is distilled off from the mixture under reduced pressure to thereby yield the quinonediazide ester for use in the present invention, in which part of phenolic hydroxyl groups is protected by the acid-decomposable group. In this connection, processes (2) and (3) can be performed by altering the sequence of the esterification step and introduction step of the acid-decomposable group or by concurrently performing these two steps.

The proportion of Ingredient (B) in the invented positive photoresist composition is preferably in a range from about 5% to about 80% by weight, and more preferably from about 10% to about 40% by weight relative to the total weight of Ingredient (A) alkali-soluble resin and Ingredient (D) sensitizer below, added according to necessity. If the proportion of Ingredient (B) is less than 5% by weight, an image in exact accordance with a pattern may not be obtained and transfer property may be deteriorated. In contrast, if it exceeds 80% by weight, sensitivity and uniformity of a formed resist film may be decreased and definition may be deteriorated.

Ingredient (C)

Ingredient (C) for use in the present invention may be any compound which generates an acid upon irradiation of light with a wavelength of 365 nm, and can be freely selected from compounds generally used as light-activatable acid generators for i-ray, such as triazine-based acid generators, oxime-sulfonate-based acid generators, and onium-salt-based acid generators (see Japanese Patent Laid-Open No. 5-107755).

Among them, preferred triazine-based acid generators include a compound represented by the following Formula (c-1):

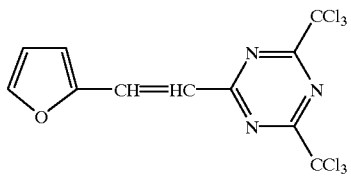

Preferred oxime-sulfonate-based acid generators include a compound represented by the following Formula (c-2):

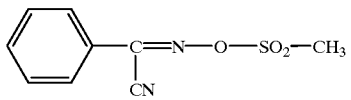

and a compound represented by the following Formula (c-3):

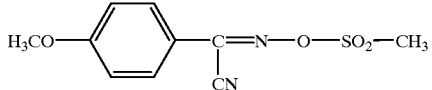

Preferred onium-salt-based acid generators include a compound represented by the following Formula (c-4):

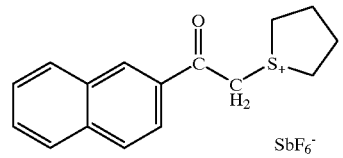

These acid generators can highly efficiently generate an acid upon irradiation of light with a wavelength of 365 nm.

Sufficient improvement in sensitivity cannot be obtained if the content of Ingredient (C) in the composition is too low or too high. The content should be preferably chosen, depending on the type of Ingredient (C), within a range from about 0.5% to about 20% by weight, and more preferably from about 1% to about 5% by weight, relative to the total weight of Ingredient (A) alkali-soluble resin and Ingredient (D) (sensitizer) mentioned below, added according to necessity.

Sensitizer (Intensifier) (D)

The invented composition may further comprise (D) a sensitizer (intensifier) according to necessity within a range not deteriorating the preferred performances of the composition.

Ingredient (D) is not specifically limited and can be freely chosen from compounds conventionally known as sensitizers (intensifiers) for use in positive photoresists.

For example, such compounds include the compounds represented by Formula (I), such as bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. Additionally, 6-hydroxy-4a-(2,4-dihydroxyphenyl)-9-1'-spirocyclohexyl-1,2,3,4,4a,9a-hexahydroxanthene, and 6-hydroxy-5-methyl-4a-(2,4-dihydroxy-3-methylphenyl)-9-1'-spirocyclohexyl-1,2,3,4,4a,9a-hexahydroxanthene can also be used.

Among them, 1,1-bis(4-hydroxyphenyl)cyclohexane, bis(4-hydroxy-3,5-dimethylphenyl)-3,4-dihydroxyphenylmethane, and 2,6-bis(3,5-dimethyl-4-hydroxybenzyl)-4-methylphenol are preferred.

When Ingredient (D) is incorporated, the content thereof is selected within a range from about 5% to about 50% by weight, and preferably from about 10% to about 40% by weight, relative to Ingredient (A) alkali-soluble resin ingredient.

The positive photoresist composition of the present invention is preferably used as a solution obtained by dissolving each of Ingredients (A), (B) and (C), and where necessary Ingredient (D) and other additional ingredients in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers or monophenyl ethers thereof, and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. Of these solvents, typically preferred are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

According to the present invention, the positive photoresist composition may further comprise various additives to further improve definition, exposure margin, and film residual rate. Such additives include, for example, p-toluenesulfonyl chloride (PTSC), 4,4'-bis(diethylamino)benzophenone, 1,4-bis[1-(2-methyl-4-hydroxy-5-cyclohexylphenyl)isopropyl]benzene, and 1,3-bis[1-(2-methyl-4-hydroxy-5-cyclohexylphenyl)isopropyl]benzene. Each of these additives can be added in a proportion of about 0.01% to about 10% by weight relative to the positive photoresist composition.

In addition to the above specified ingredients, where necessary, the positive photoresist composition of the present invention may further comprise any of compatible additives including, for example, ultraviolet absorbents for inhibition of halation and surfactants for prevention of striation within ranges not adversely affecting the objects of the present invention. Such ultraviolet absorbents include, for example, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4'-diethylaminoazobenzene, and curcumin. The surfactants include, but are not limited to, Fluorade FC-430 and FC-431 (trade names, manufactured by Sumitomo 3M Ltd., Japan), F-TOP EF122A, EF122B, EF122C, and EF126 (trade names, manufactured by Tochem Products Ltd., Japan) and other fluorine-containing surfactants.

Practically, the positive photoresist composition of the present invention may be preferably used, for example, in the following manner. Each of Ingredients (A), (B) and (C), and Ingredient (D) and other additional ingredients added according to necessity is dissolved in an appropriate solvent as mentioned above to yield a coating solution; the coating solution is then applied, using a spinner or the like, onto a substrate such as a silicon wafer, and is then dried to form a photosensitive layer; next, the photosensitive layer is exposed with a light source which emits light with a wavelength of around 365 nm, such as a low-pressure mercury lamp, a high-pressure mercury lamp, or an ultra-high-pressure mercury lamp, through a desired mask pattern; and the resultant is subjected to then post-exposure baked (PEB) treatment. The exposed portions are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several invented examples and comparative examples below, which are not intended to limit the scope of the invention.

Each of the characteristics of the resulting positive photoresist compositions was evaluated according to the following method, respectively.

(1) Sensitivity

A sample was applied onto a silicon wafer using a spinner, and was dried on a hot plate at 90° C. for 90 sec. to form a resist film having a thickness of 1.05 μm. The resist film was then irradiated for an increasing period from 0.1 sec. at intervals of 0.01 sec. using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide aqueous solution at 23° C. for 60 sec., was washed with water for 30 sec., and was dried. In this procedure, the sensitivity was defined as the exposure time period (Eth) (ms) at which the thickness of exposed portions becomes zero.

(2) Definition

The definition was defined as the critical definition at an exposure which reproduced a 0.35-μm mask pattern.

(3) Sectional Profile

A 0.35-μm wide resist pattern was subjected to scanning electron micrographic (SEM) observation on sectional profile (sectional shape).

(4) Focal Depth Range Properties

A sample was subjected to exposure and development using a reducing-type projection aligner NSR-2005i10D (manufactured by Nikon Corporation, Japan; NA=0.57) at an exposure of Eop (the exposure to yield a 0.35-μm resist pattern with a line-and-space (L&S) width of 1:1) as a standard exposure, whereas the focus was shifted up and down at this exposure. The obtained resist pattern was subjected to an SEM observation. Based upon the SEM photograph, the focal depth range property was defined as the maximum value (μm) of the focal shift (defocus) to obtain a 0.35-μm rectangular resist pattern.

Preparation Example 1

Ingredient (B) for use in Example 1 was synthetically prepared in the following manner. Initially, a diester (average esterification rate: 50%) of a phenolic compound represented by the following Formula (I-c) with 1,2-naphthoquinonediazido-5-sulfonyl chloride was synthetically prepared by a conventional method; 30 g of the diester was dissolved in 130 g of a solvent (2-heptanone); and 6.08 g of triethylamine and 3.28 g of 1-chloro-1-ethoxyethane were added to the solution and were allowed to react at 26° C. for 2 hours.

Next, the reaction mixture was put into 500 ml of a 1.5% by weight aqueous acetic acid solution, was allowed to stand, and the organic solvent layer (upper layer) was separated by decantation.

The organic solvent layer was then washed with two portions of 500 ml of pure water, and the organic solvent was removed under reduced pressure to thereby yield about 30 g of an ester in which 25% of phenolic hydroxyl groups was protected by ethylvinyl group.

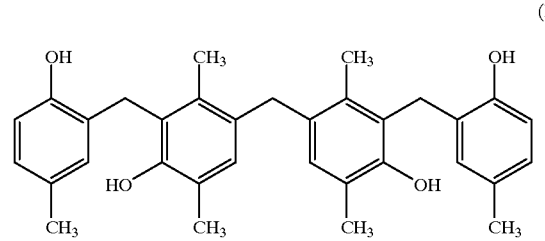

(I-c)

Example 1

Ingredient (A): a novolak resin having a weight average molecular weight of 4000, which was obtained by a condensation reaction between m-cresol and formaldehyde and by removing low molecular weight fractions therefrom by fractionation Ingredient (B): a quinonediazide ester prepared in Preparation Example 1, in which 50% of total phenolic hydroxyl groups was esterified and 25% of the same was protected by ethylvinyl group Ingredient (C): an oxime-sulfonate-based acid generator represented by the following Formula (c-2):

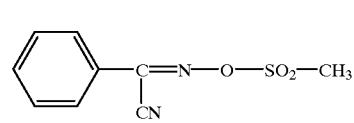

(c-2)

Ingredient (D): a phenolic compound represented by the following Formula (d-1):

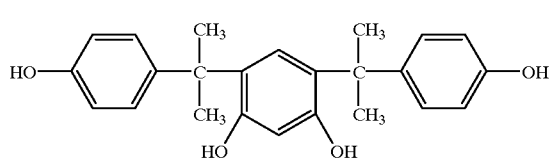

(d-1)

In 480 parts by weight of 2-heptanone, 100 parts by weight of Ingredient (A), 47 parts by weight of Ingredient (B), 5 parts by weight of Ingredient (C) and 35 parts by weight of Ingredient (D) were dissolved, and the resulting solution was filtrated through a 0.2-μm membrane filter to yield a positive photoresist composition.

Characteristics (1) to (4) of the above-prepared positive photoresist composition are shown in Table 1.

Example 2

A positive photoresist composition was prepared in the same manner as in Example 1, except that, instead of Ingredient (B) used in Example 1, a quinonediazide ester of a phenolic compound represented by the following Formula (I-d) was used, in which 50% of total phenolic hydroxyl groups was esterified with 1,2-naphthoquinonediazido-5-sulfonyl group and 25% of total phenolic hydroxyl groups was protected by ethylvinyl group.

Characteristics (1) to (4) of the above-prepared positive photoresist composition are shown in Table 1.

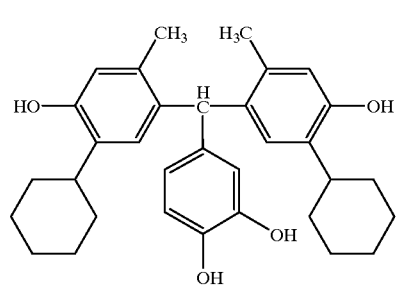

(I-d)

Example 3

A positive photoresist composition was prepared in the same manner as in Example 1, except that, instead of Ingredient (C) used in Example 1, a triazine-based acid generator represented by the following Formula (c-1) was used.

Characteristics (1) to (4) of the above-prepared positive photoresist composition are shown in Table 1.

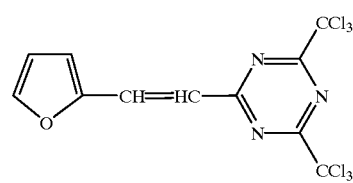

(c-1)

Comparative Example 1

A positive photoresist composition was prepared in the same manner as in Example 1, except that a quinonediazide ester of the phenolic compound used in Ingredient (B) of Example 1, in which 50% of total phenolic hydroxyl groups was esterified with 1,2-naphthoquinonediazido-5-sulfonyl group, was used instead of Ingredient (B) used in Example 1.

Characteristics (1) to (4) of the above-prepared positive photoresist composition are shown in Table 1.

Comparative Example 2

A positive photoresist composition was prepared in the same manner as in Example 1, except that, instead of Ingredient (C) used in Example 1, an onium-salt-based acid generator diphenyliodonium triflate that generates little acid upon irradiation of light with a wavelength around 365 nm was used.

Characteristics (1) to (4) of the above-prepared positive photoresist composition are shown in Table 1.

Comparative Example 3

A positive photoresist composition was prepared in the same manner as in Example 1, except that a novolak resin having a weight average molecular weight of 4500 [m-cresol/p-cresol=42.5/57.5 (molar ratio)] was used instead of Ingredient (A) used in Example 1, and that a quinonediazide ester of the phenolic compound used in Ingredient (B) of Example 1, in which 50% of total phenolic hydroxyl groups was esterified with 1,2-naphthoquinonediazido-5-sulfonyl group, was used instead of Ingredient (B) used in Example 1.

Characteristics (1) to (4) of the above-prepared positive photoresist composition are shown in Table 1.

Preparation Example 2

Ingredient (A) for use in Example 4 below was prepared in the following manner. Initially, a novolak resin having a weight average molecular weight of 4000 was prepared by a condensation reaction between m-cresol and formaldehyde and by removing low molecular weight fractions therefrom by fractionation. A total of 17 g of triethylamine and 2 g of 1-chloro-1-ethoxyethane were added to 150 g of a 10% by weight solution [solvent=methyl amyl ketone:γ-butyrolactone=10:2 (by weight)] of the above-prepared novolak resin, and the mixture was allowed to react at 40° C. for 3 hours.

Next, the reaction mixture was put into 500 ml of a 1.5% by weight aqueous acetic acid solution, was allowed to stand, and the organic solvent layer (upper layer) was separated by decantation.

The organic solvent layer was then washed with two portions of 500 ml of pure water, and the organic solvent was removed off under reduced pressure to thereby yield 20 g of a novolak resin in which 10% of phenolic hydroxyl groups was protected by ethylvinyl group.

Example 4

Ingredient (A): a novolak resin obtained in Preparation Example 2 having a weight average molecular weight of 4000, in which 10% of total phenolic hydroxyl groups was protected by ethylvinyl group Ingredient (B): a quinonediazide ester of a phenolic compound represented by the following Formula (I-c), in which 50% of total phenolic hydroxyl groups was esterified with 1,2-naphthoquinonediazido-5-sulfonyl group:

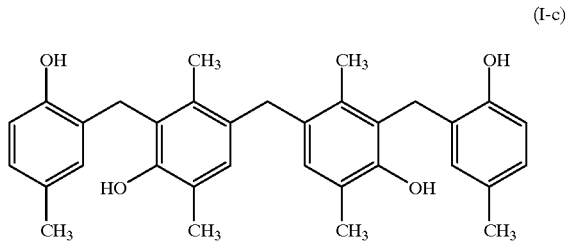
(I-c)

Ingredient (C): an oxime-sulfonate-based acid generator represented by the following Formula (c-3):

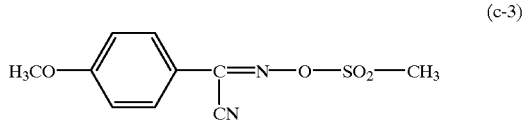
(c-3)

Ingredient (D): a phenolic compound represented by the following Formula (d-2):

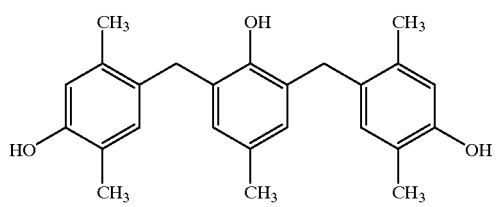
(d-2)

In 480 parts by weight of 2-heptanone, 100 parts by weight of Ingredient (A), 47 parts by weight of Ingredient (B), 5 parts by weight of Ingredient (C) and 35 parts by weight of Ingredient (D) were dissolved, and the resulting solution was filtrated through a 0.2-μm membrane filter to yield a positive photoresist composition.

Characteristics (1) to (4) of the above-prepared positive photoresist composition are shown in Table 1.

Preparation Example 3

Ingredient (A) for use in Example 5 below was prepared in the following manner. Initially, 17.8 g of triethylamine and 38.25 g of di-tert-butyl dicarbonate were added to 267 g of a 15% by weight solution [solvent=2-heptanone] of a polyhydroxystyrene having a weight average molecular weight of 8000, and the resulting mixture was allowed to react at 22° C. for 2 hours.

Next, the reaction mixture was put into 500 ml of a 1.5% by weight aqueous acetic acid solution, was allowed to stand, and the organic solvent layer (upper layer) was separated by decantation.

The organic solvent layer was then washed with two portions of 500 ml of pure water, and the organic solvent was removed off under reduced pressure to thereby yield 35 g of a polyhydroxystyrene in which 35% of phenolic hydroxyl groups was protected by t-butoxycarbonyl group.

Example 5

A positive photoresist composition was prepared in the same manner as in Example 4, except that the polyhydroxystyrene having a weight average molecular weight of 8000 and prepared in Preparation Example 3, in which 35% of phenolic hydroxyl groups was protected by t-butoxycarbonyl group, was used instead of Ingredient (A) used in Example 4.

Characteristics (1) to (4) of the above-prepared positive photoresist composition are shown in Table 1.

TABLE 1

| | (1) Sensitivity (ms) | (2) Definition (μm) | (3) Sectional Profile | (4) Focal Depth Range Properties (μm) |
|---|---|---|---|---|
| Ex. 1 | 100 | 0.30 | rectangular | 1.0 |
| Ex. 2 | 125 | 0.30 | rectangular | 1.0 |
| Ex. 3 | 77 | 0.35 | rectangular | 0.6 |
| Com. Ex. 1 | <100 | — | — | — |
| Com. Ex. 2 | >600 | — | — | — |
| Com. Ex. 3 | 440 | 0.32 | rectangular | 0.8 |
| Ex. 4 | 90 | 0.30 | rectangular | 1.0 |
| Ex. 5 | 80 | 0.30 | rectangular | 1.0 |

No resist pattern could be formed in Comparative Example 1, since unexposed portions markedly reduced in thickness in developing operation.

No isolation pattern could be formed in Comparative Example 2, since exposed portions could not be removed in developing operation.

The positive photoresist composition according to Comparative Example 3 had excellent definition but was inferior in sensitivity and focal depth range properties to those according to Examples 1 to 5.

The present invention can provide a positive photoresist composition that can form a fine pattern of about 0.35 μm in the photolithographic process using i-ray (365 nm), is excellent in DOF properties in such an ultrafine region, and has a higher sensitivity.

Other embodiments and variations will be obvious to those skilled in the art, and this invention is not to be limited to the specific matters stated above.

What is claimed is:

1. A positive photoresist composition comprising:
(A) an alkali-soluble resin;
(B) a quinonediazide ester represented by the following Formula (I):

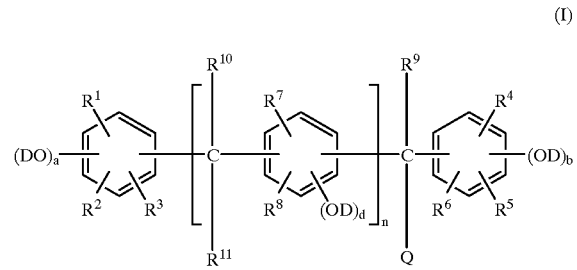
(I)

wherein each of $R^1$, $R^2$, $R^3$, $R^4$, $R^5$, $R^6$, $R^7$ and $R^8$ is independently a hydrogen atom, a halogen atom, an alkyl group having 1 to 6 carbon atoms, an alkoxy group having 1 to 6 carbon atoms, or a cycloalkyl group; each of $R^9$, $R^{10}$ and $R^{11}$ is independently a hydrogen atom or an alkyl group having 1 to 6 carbon atoms; Q is a hydrogen atom or an alkyl group having 1 to 6 carbon atoms, or Q is combined with $R^9$ to form a cyclic ring having 3 to 6 carbon atom members, or a residue represented by the following Formula (II):

(II)

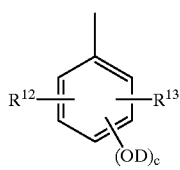

wherein each of $R^{12}$ and $R^{13}$ is independently a hydrogen atom, a halogen atom, an alkyl group having 1 to 6 carbon atoms, an alkoxy group having 1 to 6 carbon atoms, or a cycloalkyl group; and c denotes an integer of 1 to 3; each of D is independently a hydrogen atom, a 1,2-naphthoquinonediazidosulfonyl group, or an acid-decomposable group, where at least one of D is a 1,2-naphthoquinonediazidosulfonyl group and at least one of D is an acid-decomposable group; each of a and b independently denotes an integer of 1 to 3; d denotes an integer of 0 to 3; and n denotes an integer of 0 to 3; and (C) a compound which generates an acid upon irradiation of light with a wavelength of 365 nm.

2. A positive photoresist composition according to claim 1, wherein part of phenolic hydroxyl groups in Ingredient (A) is protected by an acid-decomposable group.

3. A positive photoresist composition according to claim 1 or 2, wherein a quinonediazide ester represented by the following Formula (I-a) is contained as Ingredient (B):

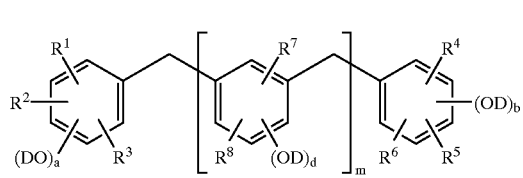

(I-a)

wherein $R^1$, $R^2$, $R^3$, $R^4$, $R^5$, $R^6$, $R^7$, $R^8$, D, a, b and d have the same meanings as defined above; and m denotes an integer of 1 to 3.

4. A positive photoresist composition according to claim 1 or 2, wherein a quinonediazide ester represented by the following Formula (I-b) is contained as Ingredient (B):

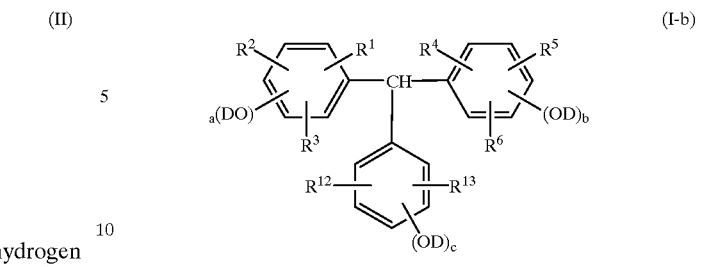

(I-b)

wherein $R^1$, $R^2$, $R^3$, $R^4$, $R^5$, $R^6$, $R^{12}$, $R^{13}$, D, a, b and c have the same meanings as defined above.

5. A positive photoresist composition according to claim 1 or 2, wherein said acid-decomposable group is a group represented by the following Structural Formula (a-1):

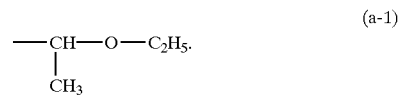

(a-1)

6. A positive photoresist composition according to claim 1 or 2, wherein said acid-decomposable group is a group represented by the following Structural Formula (a-2):

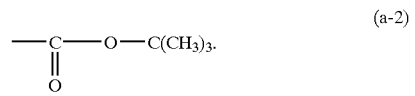

(a-2)

7. A positive photoresist composition according to claim 2, wherein from 5% to 50% of the total phenolic hydroxyl groups of Ingredient (A) is protected by the acid-decomposable group.

8. A positive photoresist composition according to claim 1 or 2, wherein from 10% to 50% of the total phenolic hydroxyl groups of Ingredient (B) is protected by the acid-decomposable group.

* * * * *